United States Patent [19]

Hariharan

[11] Patent Number: 4,543,546
[45] Date of Patent: Sep. 24, 1985

[54] SWITCHED CAPACITOR CIRCUIT WITH MINIMIZED SWITCHED CAPACITANCE

[75] Inventor: Peruvamba R. Hariharan, Fort Wayne, Ind.

[73] Assignee: Magnavox Government and Industrial Electronics Company, Fort Wayne, Ind.

[21] Appl. No.: 486,664

[22] Filed: Apr. 20, 1983

[51] Int. Cl.⁴ .............................................. H03H 11/12
[52] U.S. Cl. .................................... 333/173; 328/167; 330/51; 330/109
[58] Field of Search ........................ 333/173, 172, 165; 307/523, 520, 239, 570, 571, 578, 582; 328/151, 167, 127, 128; 330/9, 51, 66, 67, 107, 109, 110; 357/51

[56] References Cited

U.S. PATENT DOCUMENTS 4,366,455 12/1982 Berger ............................... 357/51 X
4,441,080 4/1984 Saari ................................. 330/107 X

FOREIGN PATENT DOCUMENTS 2933643 3/1981 Fed. Rep. of Germany .

*Primary Examiner*—Eugene R. LaRoche
*Assistant Examiner*—Benny T. Lee
*Attorney, Agent, or Firm*—Thomas A. Briody; William J. Streeter; Richard T. Seeger

[57] ABSTRACT

A circuit for monolithic or film stratum is adapted to have circuit capacitances integrated therein and having a minimum unit capacitance (MUC), or smallest practical capacitance that can be fabricated therein. Circuits are provided that have in one circuit arm a capacitor having a first capacity and in a second circuit arm a number N of series connected switched capacitors having a second or terminal capacity, or effective capacity between the end terminals of the second arm, that is less than the first capacity. The first capacity and second capacity form a ratio R, which is the factor by which the first capacity is greater than the second capacity. Switching is provided for each plate of each of the series connected capacitors and at the end terminals of the second arm to alternately connect the second arm into the circuit and to discharge the series connected capacitors which minimizes the effects of parasitic capacitances. Each series connected switched capacitor of the second circuit arm may have a capacity of substantially one MUC so that the terminal capacity of the second circuit arm is (1/N) MUCs and the first capacity is (R/N) MUCs. The total capacitance, or circuit capacitance, that is integrated into the stratum is (N+R/N) MUCs. N is selected to reduce or minimize the circuit capacitance and thus correspondingly reduce or minimize the integrated stratum area, reducing cost and size of the integrated stratum area for a given circuit.

14 Claims, 10 Drawing Figures

FIG. 5
PRIOR ART

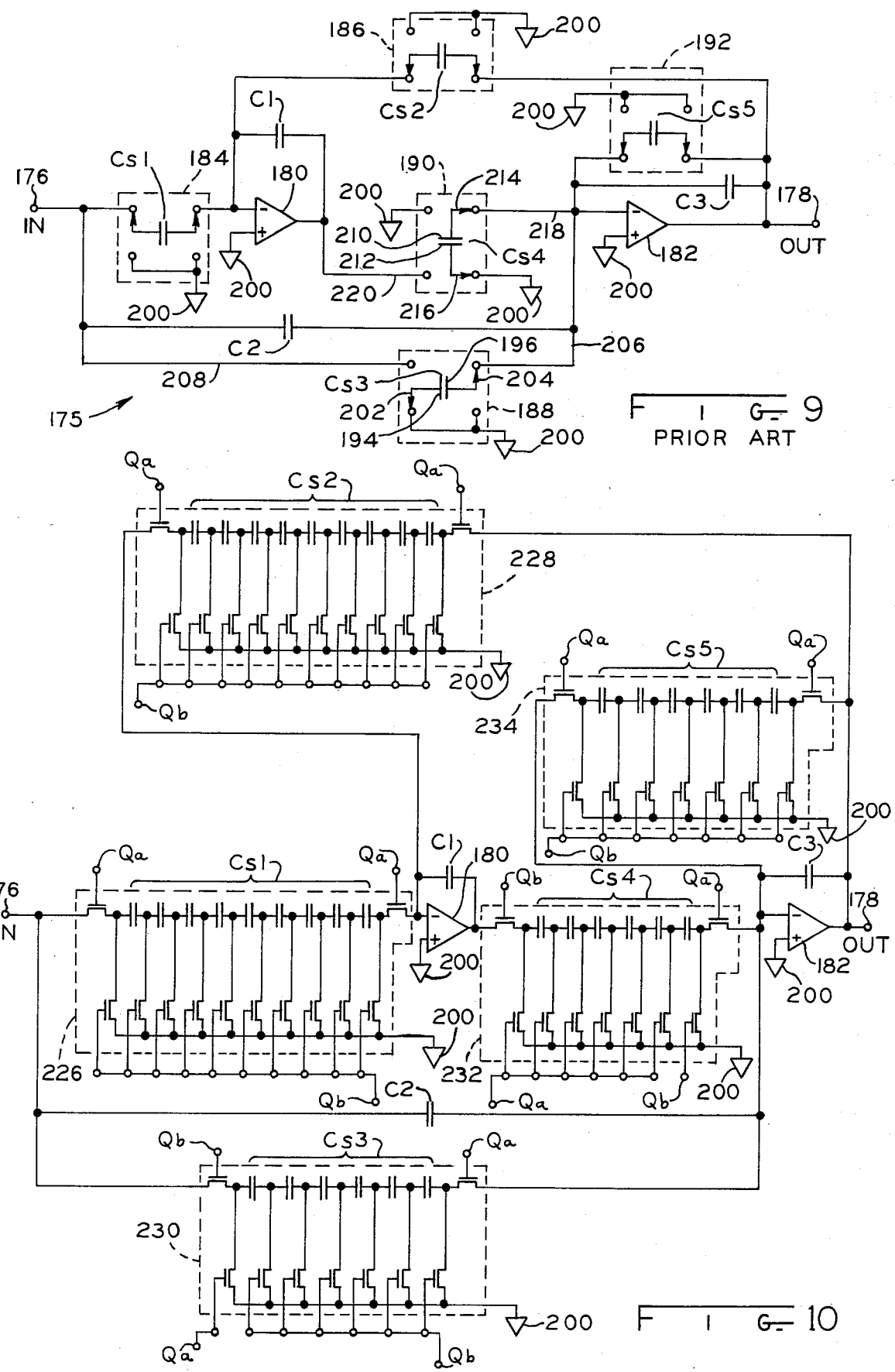

SWITCHED CAPACITOR CIRCUIT WITH MINIMIZED SWITCHED CAPACITANCE

BACKGROUND OF THE INVENTION

1. Field of the Invention

This invention is in the field of integrated circuits and more particularly those circuits using switched capacitors for providing electrical equivalents of certain of the resistive circuit elements.

2. Description of the Prior Art

Switched capacitor circuits for filtering, herein described as "SCF circuits", that are integrated in a monolithic stratum such as silicon are known in the art and discussed, for example, in the following articles:

"MOS Switch-Capacitor Filters"; Robert W. Brodersen, Paul R. Gray, and David A. Hodges; Proceedings of the IEEE, Vol. 67, No. 1, January 1979, pp. 61-74.

"First monolithic PCM filter cuts cost of telecomm systems"; Harian Ohara, Stewart Sando, Paul Gray, Dan Senderowicz; Electronic Design 8, Apr. 12, 1979, pp. 130-135.

Briefly, such switched capacitor filter circuits are active type circuits allowing input signals in certain frequency ranges to be transmitted through the filter with some predetermined gain or loss while preventing or minimizing the transmission of signals in certain other frequency ranges. In conventional, and non-switched capacitor, type active filter circuits, the inductive, capacitive, and resistive frequency selective networks which are normally used in passive type filters, are replaced with one or more active devices, such as operational amplifiers, in combination with associated capacitive and resistive networks. In switched capacitor filter circuits, such as described in the references above, certain of the resistive circuit components are replaced with respective switched capacitors and the electrical filter characteristics are a function of capacity ratios as opposed to conventional active and passive filters where the frequency characteristics are a function of the actual values of the inductance, capacity and/or resistance used in the filter networks.

Conventional active type filter circuits, by eliminating the requirement for the use of bulky inductive circuit components, are advantageously suited for implementation in integrated circuit form; however the requirement for the use of resistive circuit components is not ideal, especially where high circuit component density or tight tolerances on the resistance values are a necessity such as may for example be encountered in large scale integrated circuits and or in filters where the filter characteristics must be closely controlled. Since the requirement for resistive circuit components in the frequency controlling networks are for the most part eliminated in the prior art switched capacitor type filters, such type filters tend to overcome the problem associated with conventional active filters but only to a limited degree. Although the control of integrated circuit capacity elements are in general more easily controlled in value than are resistive type elements, the control of capacity becomes more difficult as the value of capacity decreases. Thus, there exists a minimum capacity value of an integrated circuit capacity element below which value the capacitor is not practical to make and/or the value cannot be controlled within a desired tolerance. This limitation in the prior art switched capacitor filters prohibits maximum use of the integrated circuit or monolithic stratum especially where filter circuitry is required having tightly controlled filter characteristics. This less than optimum use of the prior art switched capacitor integrated circuit "real estate" results in higher production costs and physically larger circuits.

The filter characteristics of a switched capacitor filter, as previously stated and as is well known in the art, is a function of capacity ratios. Thus, for example, the capacities in a given ratio "R" can be proportionally reduced in capacity value without either changing the ratio "R" or the particular filter characteristic which the ratio controls. The smaller of the capacities however cannot be reduced to a value lower than the smallest practical capacitance that can be fabricated or integrated on the monolith. This capacity is identified herein as a "minimum unit of capacity", or a "MUC"; it is the minimum amount of capacity which is practical to fabricate or integrate on a monolithic or film stratum and which can be controlled within desired capacity tolerances in production quantities. Obviously the actual capacitance value of a MUC will be a function of the fabrication techniques and can change for example as the monolithic state of the art changes.

"Total circuit capacitance" and "circuit capacitance" are defined herein as the actual capacitance that must be fabricated on the monolithic or film stratum to obtain the desired circuit characteristics and "terminal capacity" and "capacity" are defined herein as the measured electrical capacity between two terminals in an SCF circuit. The difference between these terms becomes significant in the following description and understanding of this invention which improves over the prior art switched capacitor circuits and provides for a much more efficient use of the stratum area than possible in the prior art circuits without sacrificing control of the filter characteristics.

SUMMARY OF THE INVENTION

In one embodiment of the invention, there is provided a switched capacitor type of filter comprising an operational amplifier having input and output terminals and having input and feedback impedance networks coupled thereto. The feedback network comprises a fixed or nonswitched capacity arm and a switched capacity arm. The input-output signal frequency characteristics of the filter are a function of the ratio of the switched capacity and the nonswitched capacity. The switched capacity arm has a number N of series connected capacitors. The series connected capacitors include a first and last capacitor and a plurality of electrical conductive means or junction points for electrically interconnecting the N number of capacitors in series including said first and last capacitors. Each one of the first and last capacitors have conductive means or terminals attached thereto to provide between said terminals the equivalent series capacity of said series connected capacitors. A signal activated semiconductor switching device of a first number of N+1 semiconductor switching devices is provided such that a switching device is coupled between a common reference potential point in the filter circuit and each one of the capacitor junction points as well as to the first and last capacitor terminals for providing capacitor discharge paths to the reference potential point. A second number of signal activated semiconductor switching device is connected in series with the series connected capacitors and between each one of the first and last capacitor terminals and the input and output terminals respectively of the operational amplifier. Switching signals of a predetermined switching frequency are coupled to each one of the semiconductor switching devices for activating said switches. The switching signals coupled to the first number of switches are of a first electrical phase while those coupled to the second number of switches are of a second phase to provide alternate connection of the series connected capacitors to said input and output terminals of the operational amplifier and to said reference point for providing discharge paths for each plate of the each one of the N number of capacitors. Each switched capacitor is approximately equal to one MUC so that the arm terminal capacity is (1/N) MUCs. Since it is the ratio R of the fixed capacitor capacity to the arm capacity that determines the filtering characteristics of the circuit, the fixed capacitor capacity is reduced by a factor of 1/N from prior art circuits. The total circuit capacitance which is required to be integrated on the stratum is then (N+R/N) MUCs and a "model N" configuration, alternatively denoted as "N1", is selected to obtain a minimum circuit capacitance. This substantially reduces the total circuit capacitance of prior art circuits where the circuit capacitance is (1+R) MUCs. As is evident from the above, the model N configuration, or N1, will be less than R to obtain the advantages of this invention. The input impedance of the above described operational amplifier also comprises a switched capacitor arm wherein the gain or loss of the filter circuit becomes a function of the ratio of the capacity of the switched input arm and the above described capacity of the switched feedback arm. This invention is not limited to feedback networks as will be herein later apparent and can be applied to sampled data and switched capacitor circuits where predetermined capacity ratios need be maintained for a predetermined circuit operation or performance. This invention can thus for example apply to such circuits including high pass filters, low pass filters, band stop filters, band pass filters, all pass filters, differential resistance-capacity integrators, two integrator loops, integrator/summers, inductance-capacitance ladder filters, infinite gain multiple feed back circuit low pass filters, doubly terminated resistance-inductance-capacitance general all-pole low pass filters, elliptic low pass filters, direct form discrete time filters, and single or multiple pole resistance capacitor low pass filters.

The model N configuration, or N1, that results in the lowest total circuit capacitance is not necessarily the "circuit N" configuration, alternatively denoted as "N2", which will result in the smallest integrated stratum area. It may be preferred to use a circuit N configuration, or N2, less than the model N of series connected and switched capacitors in order to reduce the total number of semiconductor switches required in the circuit since switches also require integrated area on the stratum and are a cost factor. This is especially true where the total circuit capacitance MUCs do not vary substantially over a range of N values in which case a smaller value of N than the model N would generally be preferred and selected. The cost of circuit capacitance compared to the cost of circuit switches, the amount of available circuit space, the complexity of a given circuit and the importance of a minimal physical size of a given circuit will for example be factors entering into such a selection. The advantages of this invention may also be realized in a circuit wherein some or all of the switched capacitors are more than a MUC, and still provide reduced total circuit capacitance.

It is therefore an object of this invention to provide a system for reducing the fabrication cost and required integrated area on a monolithic or film stratum for a switched capacitor circuit.

Another object of this invention is to provide in the system of the previous object a switched capacitor circuit wherein the smallest terminal capacity of the switched capacitors in the circuit is less than one MUC of the fabricated stratum.

A still further object is to provide in the system of the previous objects a plurality of N series connected switched capacitors each of which is approximately one MUC.

Another object of this invention is to provide a circuit having series switched capacitors wherein each interconnection point between the capacitors and the terminal points at each end of the series are periodically switched to a common capacitor discharge reference point to reduce the effects of parasitic capacitance.

The above mentioned and other features and objects of this invention and the manner of obtaining them will become more apparent and the invention itself will be best understood by reference to the following description of an embodiment of the invention taken in conjunction with the accompanying drawings, described as follows.

BRIEF DESCRIPTION OF THE DRAWINGS

FIG. 9 is a schematic of a prior art all pass network using switched capacitors; and FIG. 10 is a schematic of the circuit of FIG. 9 using the series connected switched capacitors of this invention.

DESCRIPTION OF PREFERRED EMBODIMENTS

Figure 1:
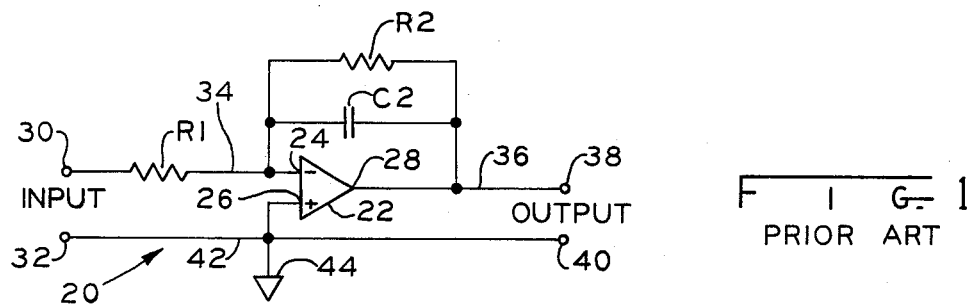
FIG. 1 is a schematic of a conventional prior art resistor capacitor active low pass filter circuit.

Referring to FIG. 1, there is shown in general schematic diagrammatic form, a conventional prior art low-pass filter 20 comprising an operational amplifier 22 having − (minus or inverting) input terminal 24, + (plus or noninverting) input terminal 26, and output terminal 28. Resistor R1 is coupled between circuit 20 input terminal 30 and − input terminal 24 in line 34 and feedback resistor R2 is coupled across amplifier 22 and between line 34 and line 36 which is between amplifier 22 output terminal 28 and circuit 20 output terminal 38. Capacitor C2 is coupled across and in parallel with resistor R2. Line 42 extends between circuit 20 input terminal 32 and output terminal 40. Ground 44 is coupled to line 42 and + input terminal 26. For circuit 20 the following equations apply:

$$f_{co} = 1/(2 \pi R2 C2) \quad \text{Equation No. 1}$$

$$\text{DC gain} = R2/R1 \quad \text{Equation No. 2}$$

where $f_{co}$ = filter cutoff frequency.

For illustrative purposes, the values of $f_{co}$, DC gain, and C2 are chosen to be:

$$f_{co} = 1000 \text{ Hz}$$

$$\text{DC gain} = 10$$

$$C2 = 0.01 \times 10^{-6} \text{ fds.}$$

In accordance with equation nos. 1 and 2, the value of the components R1, R2, FIG. 1, can be calculated and are R1 = 1.59 kilohms and R2 = 15.9 kilohms.

As is known in the art, switched capacitors can be substituted for the resistors R1 and R2. In such applications of switched capacitors, the equivalent resistance of the switched capacitor is a function of the capacity value of the switched capacitor and the switching frequency, $f_s$. The relationship of the switched capacity, switching frequency, and the resulting equivalent resistance of the switched capacitor is as follows:

$$Re = 1/(C_s f_s) \quad \text{Equation No. 3}$$

where
Re = equivalent resistance
Cs = capacity of the switched capacitor
$f_s$ = switching frequency To convert the low-pass filter shown in FIG. 1 to an equivalent switched capacitor filter (SCF) a switching frequency preferably much higher than the signal frequency or the $f_{co}$ of the circuit can be selected and using the relationship shown in Equation No. 3 the value of the switched capacitor Cs can be obtained for the respective values of each one of the resistors R1 and R2. If for illustrative purposes, the switching frequency $f_s$ is chosen to be 100 kHz then the switched capacitor capacities Cs1 and Cs2 for R1 and R2 respectively are found to be $6289 \times 10^{-12}$ fds. and $628.9 \times 10^{-12}$ fds. respectively as follows:

$$Cs1 = 1/(R1 f_s) = 1/(1.59 \times 10^8) = 6289 \times 10^{-12} \text{ fds.}$$

$$Cs2 = 1/(R2 f_s) = 1/(15.9 \times 10^9) = 628.9 \times 10^{-12} \text{ fds.}$$

A conventional prior art SCF circuit 20a having the same $f_{co}$ and DC gain as circuit 20, FIG. 1, namely 1000 Hz and 10, respectively is shown with blade switches for explanation purposes only. Switched capacitors Cs1 and Cs2 according to prior art teaching are each single capacitors, each one being alternately switched first into circuit 20a for charging and then switched to a reference potential point for discharging as is known in the art. Cs1 and Cs2 are switched respectively by switching circuits 46, 48, shown in dashed blocks, which are similar and carry like reference numerals for corresponding like elements with only circuit 46 being described but it being understood circuit 48 is constructed and functions in like manner. The opposite plates of capacitor Cs1 are coupled respectively to switchable blades 50, 52 of double pole double throw switch 54. In the positions shown, blades 50, 52 are in the down position and are connected to terminals 56, 58 respectively coupling CS1 into circuit 20a. In the up position, not shown, of blades 50, 52 connection is made with terminals 60, 62 coupling Cs1 to ground 64 and discharging Cs1. In like manner Cs2 is coupled into circuit 20a and discharged to ground 64.

Figure 2:
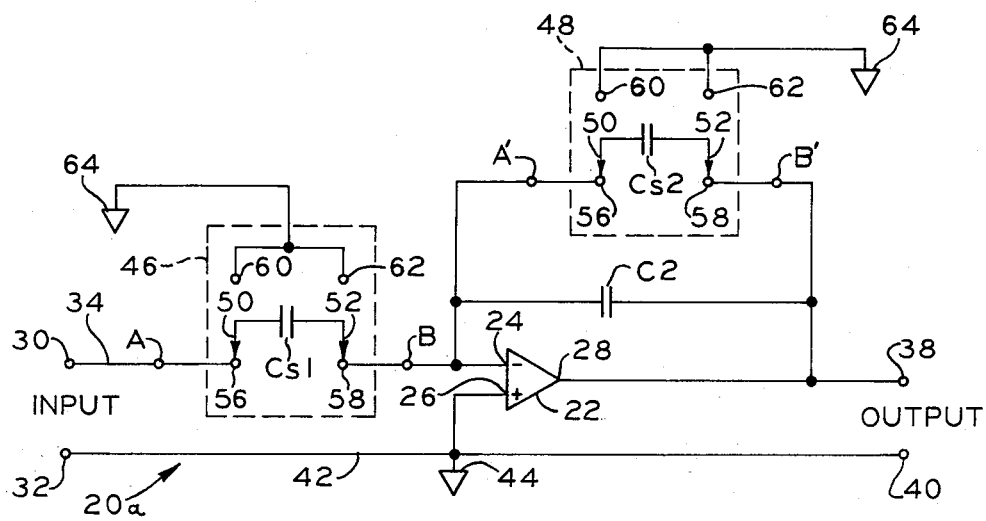
FIG. 2 is a schematic of the FIG. 1 prior art circuit using switched capacitor circuits, diagrammatically shown, for the circuit resistors.
Figure 3:
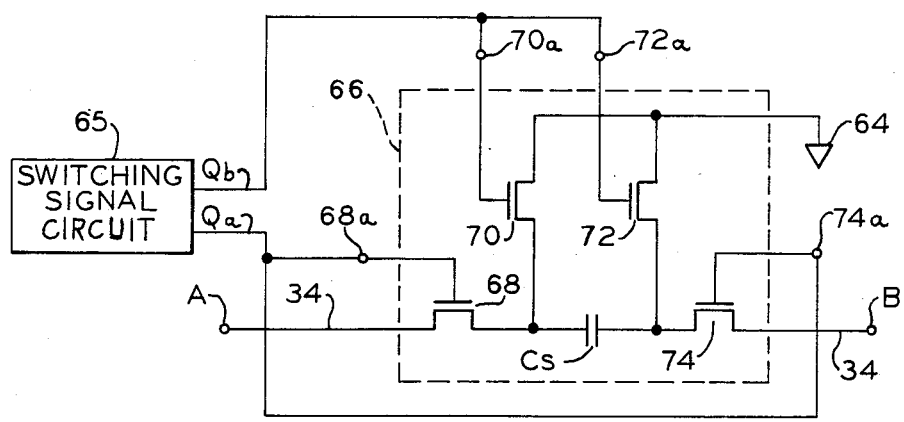
FIG. 3 is a schematic of a typical prior switched capacitor circuit which may be used for each of the switched capacitor circuits in the circuit of FIG. 2.

In actual practice, blade switch circuits 46, 48 each could be replaced with an MOS (metal oxide semiconductor) switching circuit 66 shown in a dashed block in FIG. 3. Circuit 66 is shown for capacitor Cs, it being understood that Cs may be either Cs1 or Cs2. Terminals A, B in circuit 66 would be connected to terminals A, B and to terminals A', B' in circuit 20a, FIG. 2 to replace circuits 46, 48, respectively. Other electronic switching circuits known to the art may be substituted for switches 46, 48. In circuit 66, MOS switches 68, 70, 72, 74 having switching terminals 68a, 70a, 72a, 74a respectively are used for switching devices. Phased switching signal circuit 65 provides phased switching signals Qa, Qb which are 180° out of phase in this embodiment. Switching, or clock phase, signal Qa is applied to switching terminals 68a, 74a and switching, or clock phase, signal Qb is applied to switching terminals 70a, 72a to provide alternate switching as is known in the art. When signal Qa is applied to terminals 68a, 74a switches 68, 74 are closed and since signal Qb is not being applied, switches 70, 72 are open. When signal Qb is being applied to terminals 70a, 72a, switches 70, 72 are closed and since signal Qa is not being applied, switches 68, 74 are open. This switching is the equivalent of that provided by each of circuits 46, 48 in circuit 20a.

In the SCF circuit 20a, FIG. 2, the total circuit capacitance is relatively large and requires a proportionately large integrated area in the monolith or film stratum. The major portion of the total circuit capacitance is that of capacitor C2. The prior art teaches that since filter characteristics in a SCF circuit are a function of capacity ratios rather than actual capacity values, the capacity of capacitor C2 and the total circuit capacity can be reduced. For example, in the low-pass filter circuit 20, FIG. 1, Re as expressed in Equation No. 3 can be substituted for R1 and R2 respectively in Equation Nos. 1 and 2. In doing so, it can be shown that both $f_{co}$ and the DC gain of the filter are functions of capacity ratios:

$$2 \pi f_{co} = f_s Cs2/C2; \quad \text{Equation No. 4}$$

$$\text{DC gain} = Cs1/Cs2 \quad \text{Equation No. 5}$$

Using as an example the same $f_{co}$, DC gain, and $f_s$ as was used for circuit 20a, FIG. 2, namely 1000 Hz, 10, and 100 kHz, respectively, the capacity ratios are found to be:

$$C2/Cs2 = 0.01 \times 10^{-6}/(628.9 \times 10^{-12}) = 15.9 \quad \text{Ratio-1}$$

$$Cs1/Cs2 = 6289 \times 10^{-12}/(628.9 \times 10^{-12}) = 10 \quad \text{Ratio-2}$$

Therefore, by reducing Cs2 to the smallest possible capacity value, C2 and Cs1 will also be reduced in accordance with Ratio-1 and Ratio-2, respectively. Cs2 can be reduced to, but not less than, the minimum unit capacitance, or MUC, that is associated with the particular material of the stratum and method of fabrication of the circuit. Using Ratio-1 and Ratio-2, the prior art teaches that when capacitor Cs2 is one MUC, capacitor C2 is 15.9 MUCs and capacitor Cs1 is 10 MUCs, the total circuit 20b capacitance equals the sum of the terminal capacity of capacitors Cs2, C2, and Cs1, or 26.9 MUCs.

It is a purpose of this invention to reduce the total circuit capacitance of an SCF circuit. In general, the manner in which this is accomplished is to subdivide certain of the switched capacitors into a number N of series connected switched capacitors. Thus applying this invention to the low-pass SCF circuit 20a, FIG. 2, the switched capacitor Cs2 is replaced with a number N of series connected and switched capacitors, each being preferably equal to approximately one MUC, as shown in SCF circuit 20b, FIG. 4, later described. Thus the terminal capacity of capacitor Cs2, or capacity between terminals A' and B' of circuit 48, will be reduced from one MUC to the reciprocal of N or (1/N) MUCs. Although the number of MUCs required for fabrication of Cs2 will increase by a factor of N, the required capacitances required for the fabrication of Cs1 and C2 will decrease resulting in a substantial reduction of total circuit capacitance.

To illustrate, the corresponding terminal capacities will now be a function of N as follows for the aforestated numerical Ratios 1 and 2:

$$Cs2 = (1/N)MUCs$$

$$Cs1 = (\text{Ratio-2}/N)MUCs = (10/N)MUCs$$

$$C2 = (\text{Ratio-1}/N)MUCs = (15.9/N)MUCs$$

Since Cs2 is comprised of N series connected switched capacitors each of which is one MUC, the number of circuit capacitances for Cs2 is N MUCs. Adding the above, the total circuit capacitance MUCs becomes:

$$(N + 10/N + 15.9/N)MUCs = \text{Total Circuit capacitance in } MUCs$$

or:

$$(N + 25.9/N)MUCs = \text{Total Circuit capacitance in } MUCs \quad \text{Equation No. 6}$$

In the above, it is noted that for a series connected switched capacitor, the total circuit capacitance is not the terminal capacity of (1/N) MUCs but the sum of the capacitances of all the series connected capacitors or N MUCs.

For a given set of Ratios 1 and 2 and a given circuit configuration, the expression for total circuit capacitance MUCs, Equation No. 6 above, can be solved for a model N configuration, or N1, which will provide the minimum total circuit capacitance MUCs using state of the art mathematics and/or computer techniques. For Equation No. 6, the model N configuration, or N1, is found to be approximately 5. Using this value for N, Cs2 will comprise 5 series connected and switched capacitors, each one being substantially equal to one MUC. The terminal capacity of Cs2 as measured between terminals A and B is now 1/N or 0.2 MUCs in lieu of the previous value of one MUC. Although Cs2 now requires 5 MUCs of circuit capacitance, the capacity values of Cs1 and C2 are reduced in value to 2.0 MUCs and 3.18 MUCs respectively in lieu of their original values of 10 and 15.9 MUCs, respectively. Thus the total circuit capacitance required for fabrication of the SCF circuit 20a has therefore been reduced from the previously obtainable minimum of 26.9 MUCs to approximately 10.18 MUCs (5+2.0+3.18).

Figure 4:
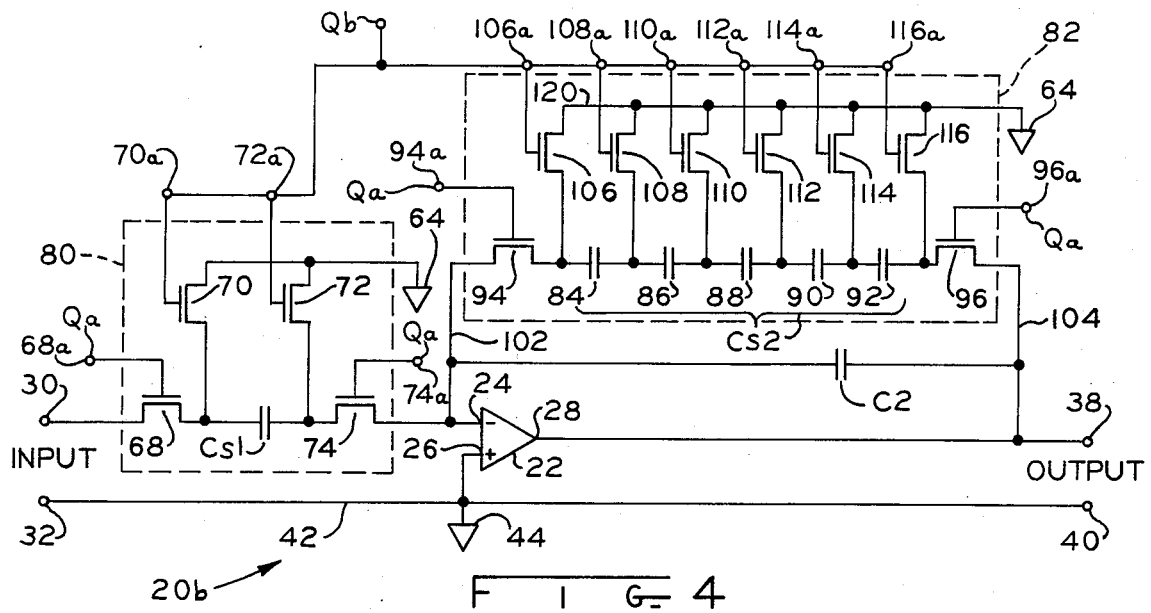
FIG. 4 is a schematic of the FIG. 2 circuit using the series connected switched capacitors of this invention.

Referring now to FIG. 4, SCF circuit 20b of this invention incorporating the five series connected switched capacitors for Cs2 is shown. Circuit 20b has the same electrical filter characteristics as circuits 20 and 20a of FIGS. 1 and 2, respectively, and requires less than one half of the total circuit capacitance of prior art circuit 20a that uses state of the art switched capacitors, such as shown in FIG. 3. Circuit 20b is similar to circuit 20a and like reference numerals identify like elements. Switched capacitor 80 is similar in construction, operation, and function to circuit 66a. Switched capacitor circuit 82 replaces circuit 66 and capacitor Cs2 is replaced by five series connected capacitors 84, 86, 88, 90, 92. MOS switches 94, 96 have switch terminals 94a, 96a respectively which are connected to switch signal Qa. Switch 94 is connected between capacitor 84 and line 102 and switch 96 is connected between capacitor 92 and line 104. MOS switches 106, 108, 110, 112, 114 have switch terminals 106a, 108a, 110a, 112a, 114a respectively each of which is connected to switch signal Qb. Switch 106 is connected from a point between switch 94 and capacitor 84 to ground line 120; switch 108 is connected to a point between capacitors 84, 86 and ground line 120; switch 112 is connected to a point between capacitors 88, 90 and ground line 120; switch 114 is connected to a point between capacitor 90, 92 and ground line 120; switch 116 is connected to a point between capacitor 92 and switch 96 and ground line 120. Switching signal Qa is applied to switch terminals 68a, 74a, 94a, 96a, and switching signal Qb is applied to switch terminals 70a, 72a, 106a, 108a, 110a, 112a, 114a, 116a. Switches 68–74 94, 96, 106–116 used to switch capacitors Cs1, 84–92 can be any desired type although they are shown in FIG. 4 as MOS type switches which are well known in the art. As explained, the electrical equivalent of these MOS switches is shown in FIG. 2. The switching of all the switched capacitors Cs1, 84–92 occurs at the switching frequency fs. The switching signals Qa, Qb, provided by a circuit such as switching signal circuit 65, FIG. 3, are applied to the switch terminals at frequency $f_s$, the phase of the Qa signal being out of phase with the Qb signal to provide alternate switching of their respective switches. However, the present invention is not limited to the use of the disclosed type switches. Also in the improved filter in accordance with the invention and shown in FIG. 4, only one capacitor arm having series connected switched capacitors 84–92 was utilized. This invention is not limited to a single arm of series connected switched capacitors in a circuit and, as will become apparent, several circuit arms may be comprised of series connected switched capacitors.

The relative capacity Ratios 1 and 2 may of course be different than those given in the above illustrative example. For example, assuming the aforestated Ratio-1 is 100 and Ratio-2 is 2 for the circuit 20b, FIG. 4, and in accordance with the teaching of this invention, the start point is to provide series connected switched capacitors for the smallest capacity capacitor resulting in the following relative capacities:

$$Cs2 = 1/N$$

$$Cs1 = \text{Ratio-2}/N = 2/N$$

$$C2 = \text{Ratio-1}/N = 100/N$$

The previously obtainable minimum circuit capacitance using conventional prior art techniques would be 103 MUCs which is the total of: 1 MUC for Cs2; 2 MUCs for Cs1; and 100 MUCs for C2.

In general, when any of the resulting terminal capacities as determined from the relative capacity, or MUC, ratios divided by N is less than one MUC, that capacity is replaced with a series capacitor combination. In the immediately preceding example, the resulting terminal capacity expressed in MUCs of Cs1 will be less than one MUC for values of N greater than 2. If both Cs2 and Cs1 are series switched then the required circuit capacitance MUCs for both Cs2 and Cs1 will be the reciprocal of their above capacity expressions and the total circuit capacitance expressed in MUC's will be as follows:

The corresponding circuit capacitances will now be a function of N as follows for the aforestated numerical Ratios 1 and 2:

$Cs2 = N$ MUCs $Cs1 = (N/\text{Ratio-2})$MUCs $C2 = (\text{Ratio-1}/N)$MUCs

Adding the above, the total circuit capacitance in MUCs becomes:

$N + N/\text{Ratio-2} + \text{Ratio-1}/N =$ Total Circuit capacitance in MUCs,    Equation No. 7

As in the previous example, the model N for providing a minimum of circuit capacitance is found by determining that N which results in the minimum total MUCs for the circuit. Solving such expressions for total circuit capacitance using numerous values of N can be easily accomplished with the aid of commercially available "desk top" computers or by employing the principles of calculus. When the above expression for total circuit capacitance is solved, a model N configuration, or N1, value of 8 is found that will provide a minimum total circuit capacitance of approximately 24.5 MUCs, Cs2=8 MUCs, Cs1=4 MUCs, and C2=12.5 MUCs. Cs2 comprises 8 switched one MUC capacitors and Cs1 comprises 4 switched one MUC capacitors. This reduced circuit capacitance results from switching each of series connected capacitors for both capacitors Cs2 and Cs1 in accordance with this invention and provides a total circuit capacitance, 24.5 MUCs, that is less than one quarter of that previously obtainable, viz. 103 MUCs.

It is understood that although the model N value will provide the minimum total circuit capacitance, in some instances it may be preferred to use less than the model N number of series connected and switched capacitors in order to reduce the total number of switches required in the circuit. This is especially true there the total circuit MUCs do not vary to any great extent over a range of N values in which case a smaller value of N, or circuit N, would generally be preferred and selected. The cost of circuit capacitance compared to the cost of the switches, the amount of available circuit space, the complexity of a given circuit, and the importance of a minimal physical size of a given circuit will for example be factors entering into such a selection. In the type of switching shown in FIG. 4, the total number of MOS switches reqired for a given number of series switched capacitors is equal to N+3. Other types of switches and switching circuitry can however be used as desired.

In order to exemplify the use of a lesser number of series switched capacitors in the above described improved SCF using 8 and 4 switched series connected capacitors for Cs2 and Cs1 respectively, an N value of 5, instead of 8, could be selected and would provide a total circuit capacitance of slightly more than 27.5 MUCs in lieu of the 24.5 MUCs, yet it still provides a considerable reduction of 103 MUCs total circuit capacitance previously obtainable. It is noted that since the N value of 5 is an odd integer, 5 capacitors each of one MUC can be series connected switched capacitors for capacitor Cs2 to provide an equivalent terminal capacitance of 0.2 MUCs; however the terminal capacity of Cs1 is now 0.4 MUCs and three switched series connected capacitors of 1.2 MUCs are required. 0.4 MUCs can be mathematically obtained by use of 2.5 series connected one MUC capacitors but 2.5 capacitors are not physically possible. 0.4 MUCs can also be mathematically obtained by the use of 2 series connected capacitors of 0.8 MUCs each, but 0.8 MUC is less than one MUC and therefore not feasible. The total circuit capacitance of this improved SCF circuit is approximately 28.6 MUCs since the switched series capacitors for capacitor Cs1 are 3 capacitors of 1.2 MUCs each. As mentioned, in order to provide the "minimum" total circuit capacitance of 24.5 MUCs, capacitors Cs2 and Cs1 comprise 8 and 4 one MUC capacitors, respectively. However, the "practical minimum" total circuit capacitance is 28.6 MUCs, since the total integrated area required by the capacitors and switches on the stratum will be less using this number.

Figure 5:
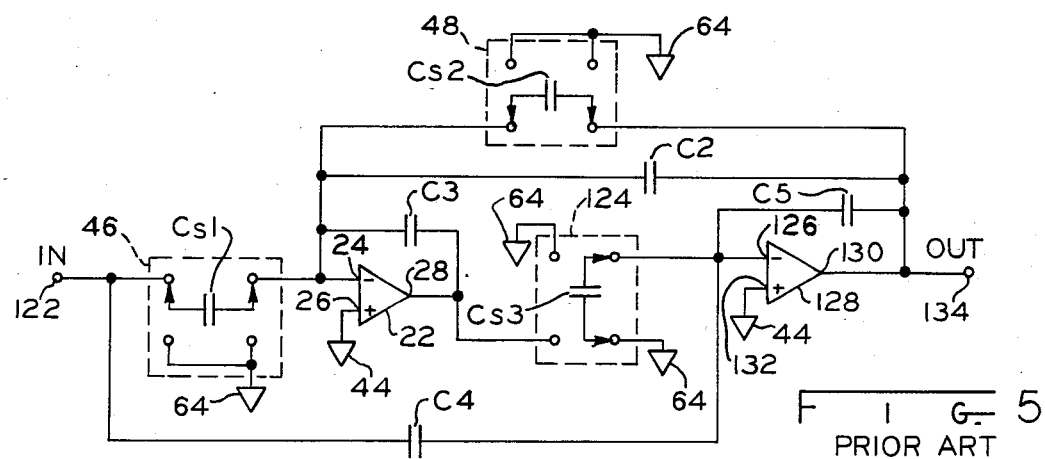
FIG. 5 is a schematic of a prior art active two pole band stop filter circuit using switched capacitor circuits.

Referring to FIG. 5, there is shown a more complex filter in the form of a two pole bandstop filter depicting prior art SCF circuit switching. Reference numerals and symbols used in FIG. 2 are used in FIG. 5 for corresponding elements having similar construction, operation and function. Switched capacitor 46 is coupled between input terminal 122 and − input terminal 24 to amplifier 22. Capacitor C3 is coupled between output terminal 28 and − input terminal 24. Switched capacitor 124 is coupled between output terminal 28 and the − input terminal 126 of operational amplifier 128 which has output terminal 130 and + input terminal 132. Capacitor C4 is coupled between circuit input terminal 122 and − input terminal 126. Capacitor C5 is coupled between − input terminal 126 and output terminal 130 which is coupled to circuit output terminal 134. The circuit thus described is a conventional prior art circuit and operates in conventional manner as is understood in the art. It is understood that the operation of the various circuits described herein as prior art circuits is known to the art. The circuits of this invention are the electrical equivalents of their respective prior art circuits but require substantially less integrated area as herein explained.

For an illustrative example, in the circuit of FIG. 5 the ratio of the capacities of each non-switched capacitor to the terminal capacity of switched capacitor Cs1, which is one MUC, and the ratio of the terminal capacity of each switched capacitor to the terminal capacity of switched capacitor Cs1 are as follows:

$Cs2/Cs1 = 1$; $Cs3/Cs1 = 1$; $C2/Cs1 = 55$; $C3/Cs1 = 198$;

$C4/Cs1 = 50$; $C5/Cs1 = 198$.

As used herein, an "s" following a "C"; thus "Cs", when referenced to a capacitor, denotes that the capacitor referenced is a switched capacitor. The absence of an "s" after a "C", thus "C", when referenced to a capacitor denotes that the capacitor is nonswitched.

Using these ratios, the total MUCs in the circuit of FIG. 5 is 504, which is the arithmetic sum of the ratios, and is the minimum total circuit capacitance in MUCs previously obtainable. In the circuit of FIG. 5, capacitors Cs1, Cs2, Cs3 are conventional switched capacitors each comprising a single switched capacitor of one MUC each. Capacitors C3, C4, C5 and C7 are each nonswitched capacitors. The conventionally switched SCF circuit of FIG. 5 can also be improved in accordance with the present invention to provide a much lower total circuit capacitance than previously possible with the prior art circuits. In the filter shown in FIG. 5, the three capacitor arms containing Cs1, Cs2, Cs3 respectively can each be series switched in accordance with this invention, thereby reducing the required capacity of C2, C3, C4, C5. Although the number N of series switched capacitors in each respective arm need not be identical, for the purpose of again illustrating the invention, N is assumed to be identical in this particular example. The relative capacity ratios of the various capacitors of the filter are as previously stated, a function of the desired filter characteristics as is known in the art and numerical ratios are assigned to the capacitors in FIG. 5 as well as in the other examples contained herein for the purpose of describing and explanation of this invention.

Since the three capacitor arms containing the conventional switched capacitors Cs1, Cs2, Cs3 are all of the same minimum value ratio of one MUC each, each respective capacitor may be series switched using N number of capacitors of one MUC each.

The circuit capacitance of each capacitor in MUCs is represented as follows where N = the number of switched series connected capacitors of one MUC each for Cs2:

$$Cs1 = N;\ Cs2 = N;\ Cs3 = N;\ C2 = 55/N;\ C4 = 50/N;\ C3 = 198/N;\ C5 = 198/N.$$

The expression representing the total circuit capacitance in MUCs thus becomes:

$$N + N + N + 55/N + 50/N + 198/N + 198/N = \text{Total Circuit capacitance in } MUCs$$

Combining, this becomes:

$$3N + 501/N = \text{Total Circuit in } MUCs$$

When this expression is solved for a model N, or N1, that will give a minimum number of total Circuit capacitance MUCs, N is found to be approximately 13. Using an N of 13 will provide a total minimum circuit capacity of approximately 77.5 MUCs which is approximately 15% of the total capacity of 504 MUCs which is the minimum obtainable with the filter of FIG. 5 using conventional switching capacitor circuitry. As previously stated, in practice it may be desirable to use a value of N which is less than the model N configuration to reduce the number of switches required on the monolithic stratum. As an example, using an N value of 6 in the foregoing examples provides a total circuit capacitance of approximately 101 MUCs and yet provide a reduction to approximately one fifth or 20% of the 504 MUCs, the minimum previously obtainable with the prior art switching circuits of FIG. 5. Using an N value of 4 provides a minimum circuit capacitance of approximately 137.25 MUCs which is still considerably less than the previously obtainable minimum of 504 MUCs and provides a circuit that has considerably fewer switches than a circuit with an N value of 6.

Figure 6:
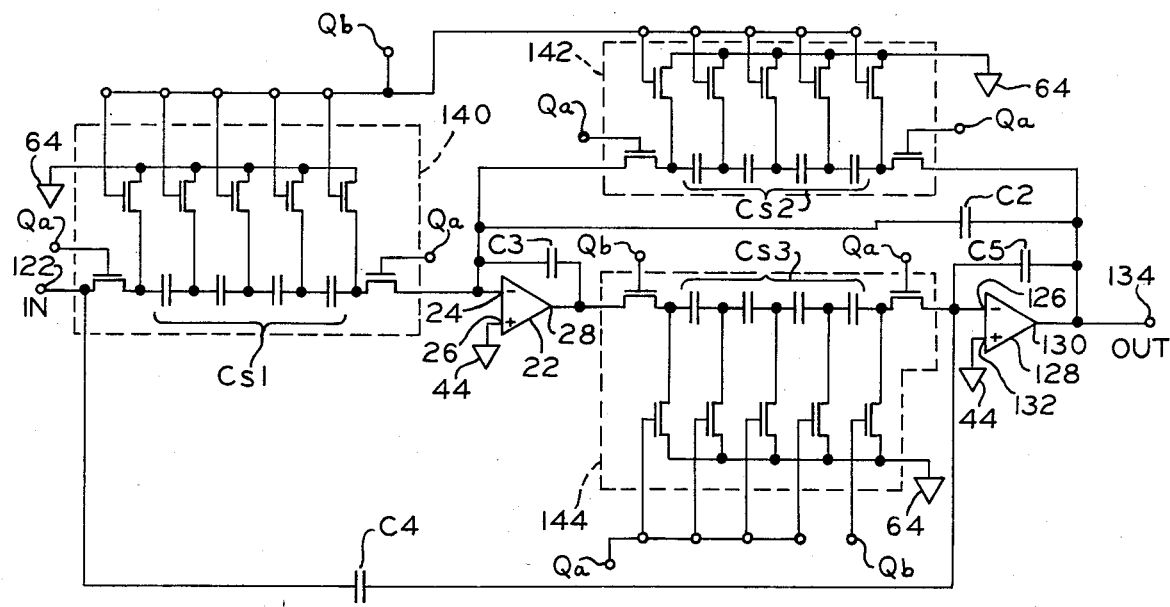
FIG. 6 is a schematic of the FIG. 5 circuit using the series connected switch capacitors of this invention.

Referring to the circuit of FIG. 6, a SCF circuit is shown using the series switched capacitors and an N value of 4 in accordance with the present invention. The circuit of FIG. 6 shows series connected switched capacitor circuits shown in dashed blocks 140, 142, 144 connected in the circuit of FIG. 5 in place of circuits 46, 48, 124 respectively. Circuits 140, 142, 144 are similar in construction, operation and function to circuit 82 of FIG. 4 with an exception that each circuit 140, 142, 144 has 4 series connected switched capacitors instead of the 5 series connected switched capacitors in circuit 82. The description of and explanation for circuit 82 also applies to circuits 140, 142, 144. The MOS switches are similarly shown in FIGS. 4 and 5 and the switching signals Qa, Qb are derived and applied to their respective switching terminals, and operate at a frequency $f_s$ to open and close the MOS switches as previously described.

All individual switched capacitors of the series switched capacitor arms in circuits 140, 142, 144 shown in FIG. 6 are one MUC capacitors. Therefore the equivalent or terminal capacity of each one of the series switched arms i.e. Cs1, Cs2, Cs3 is 4 MUCs, and using the above capacity ratios, C2 = 13.75 MUCs; C3 = 49.5 MUCs; C4 = 12.5 MUCs; and C5 = 49.5 MUCs, which totals the previously mentioned 137.25 MUCs for the total circuit capacitance when N = 4.

Figure 7:
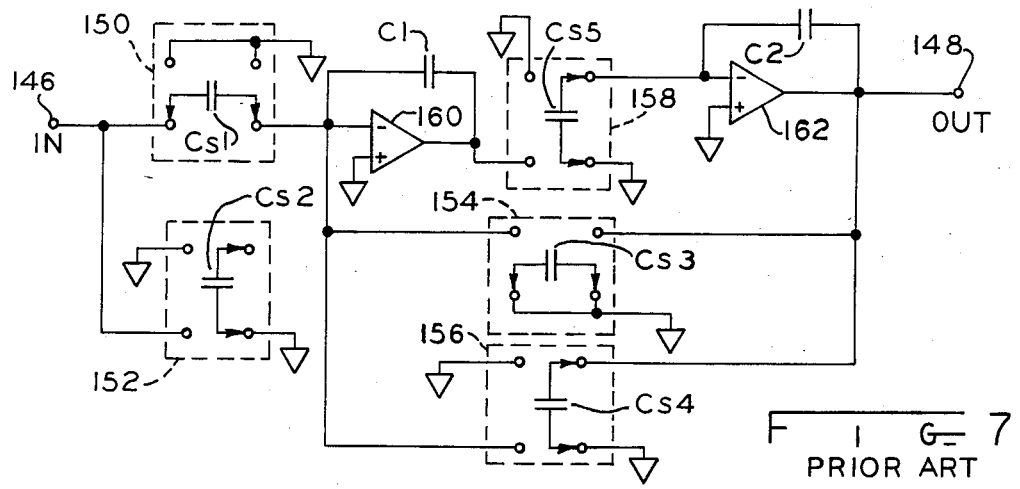
FIG. 7 is a schematic of a prior art two pole active bandpass filter using switched capacitors.

Referring to FIG. 7, there is shown a two pole bandpass filter as another example of a SCF circuit in which the total circuit capacitance can be reduced in accordance with this invention. In the SCF circuit of FIG. 7, capacitors Cs1, Cs2, Cs3, Cs4, Cs5 are conventional switched capacitors of the prior art. Capacitors C1, C2 are nonswitched capacitors. Input signals are applied to terminal 146 and output signals are at terminal 148. The five switched capacitor circuits, shown in dashed blocks, 150, 152, 154, 156, 158 each are constructed, operate, and function in the manner described for switched capacitor 46, FIG. 2 and have similar symbols to represent corresponding components. Operational amplifiers 160, 162 are of the type and operate in the manner of operational amplifier 22, FIG. 2.

An illustrative example for the circuit of FIG. 7 is provided by assigning the following numerical ratios: the ratio of the capacities of each nonswitched capacitor to the terminal capacity of switched capacitor Cs1, which is one MUC, and the ratio of the terminal capacity of each switched capacitor to the terminal capacity of switched capacitors Cs1 are as follows:

$$Cs1/Cs1 = 1;\ Cs2/Cs1 = 1;\ Cs3/Cs1 = 11;\ Cs4/Cs1 = 1;\ Cs5/Cs1 = 1;\ C1/Cs1 = 140;\ C2/Cs1 = 1;$$

Using these ratios, the total MUCs in the circuit of FIG. 7 is 156, which is the arithmetic sum of the ratios, and is the minimum total circuit capacitance in MUCs previously obtainable. In the circuit of FIG. 7, capacitors Cs1, Cs2, Cs4, Cs5 are conventional switched capacitors each comprising a single switched capacitor of one MUC and Cs3 is a single switched capacitor of 11

MUCs. Capacitors C1, C2, are each nonswitched capacitors. Since the smallest capacitors, i.e. Cs1, Cs2, Cs4, Cs5, C2 are each one MUC, the 156 MUC total cannot be further reduced using the conventional switching circuitry.

In the particular circuit of FIG. 7, capacitors Cs5, C2 are associated with the second operational amplifier of the filter and the ratio of Cs5 to C2 may be treated separately from the remaining capacitors of the SCF circuit; therefore Cs5 may remain as a single one MUC switched capacitor and C2 may remain as a single nonswitched capacitor, if so desired.

The conventionally switched SCF circuit of FIG. 7 can also be improved in accordance with the present invention to provide a much lower total circuit capacitance than previously possible with the prior art circuits. The circuit capacitance of each capacitor in MUCs is represented as follows where N = the number of series connected switched capacitors of one MUC each for Cs1:

$$Cs1 = N;\ Cs2 = N;\ Cs4 = N;\ Cs3 = 11/N;\ C1 = 140/N;\ Cs5 = N/N;\ C2 = N/N.$$

The expression representing the total circuit capacitance in MUCs thus becomes:

$$N + N + N + 11/N + 140/N + 2N/N = \text{Total Circuit capacitance in } MUCs$$

Combining, this becomes:

$$3N + 151/N + 2 = \text{Total Circuit in } MUCs$$

When this expression is solved for a model N that will give a minimum number of total Circuit capacitance MUCs, N is found to be approximately 7. Using an N of 7 will provide a total minimum circuit capacity of approximately 44.6 MUCs which is approximately 28.5% of the total capacity of 156 MUCs which is the minimum obtainable with the filter of FIG. 7 using conventional switching capacitor circuitry.

When a single switched or sampling capacitor of a switched capacitor circuit is simply replaced by a number of series connected capacitors, in order, for example to reduce its capacity, the parasitic capacities associated with each individual capacitor of the series connected configuration must be separately discharged as is shown herein in accordance with the present invention. Although parasitic capacities can be associated with nonswitched capacitors and can affect circuit characteristics, they do not pose a discharge problem and therefore a nonswitched capacitor can be comprised of a number of individual capacitors connected in series in order to reduce the capacity of the nonswitched capacitor. In view of this, the capacitors Cs5 and C2 of the prior art filter shown in FIG. 7 can if desired be comprised of series connected capacitors in accordance with the present invention. As an example, the previously described capacitor Cs5 of one MUC can be comprised of 7 one MUC series connected and switched capacitors and C2 can be comprised of 7 series connected one MUC capacitors in a nonswitched configuration. This will however result in an increase of the total circuit capacitance from 44.6 to approximately 56.6 MUCs.

One of the advantages of using a series switched configuration in lieu of a single switched capacitor for C1 and likewise a number of series connected capacitors for the single nonswitched capacitor C2 is that the effects of the parasitic capacities associated with each one of the individual series connected capacitors are correspondingly smaller in value and are also physically distributed over a larger area. With certain physical circuit configurations this distribution can result in better control of the fabricated capacitors and the associated parasitic capacities; in some instances, for example where a portion of the parasitic capacity of a given single capacitor results from the proximity of the single capacitor to another physically close circuit component, the redistribution of the parasitic capacities resulting from the series connected configuration can result in a reduction of the effects of parasitic capacity. Series connected capacitors can also provide more flexibility of the physical placement of individual capacitors to provide a lesser amount of the effects of these undesired parasitic capacities.

One possible SCF circuit in accordance with the invention could be comprised of 7 series switched one MUC capacitors for each one of capacitors Cs1, Cs2, C24; a single switched 1.57 MUC capacitor for Cs3; a single 20 MUC capacitor for C1; a single one MUC switched capacitor for Cs5; and a single one MUC nonswitched capacitor for C2. The actual circuit and switching would be as shown in FIG. 8 except the number of series connected capacitors would be 7 instead of the 4 shown and described below.

Figure 8:
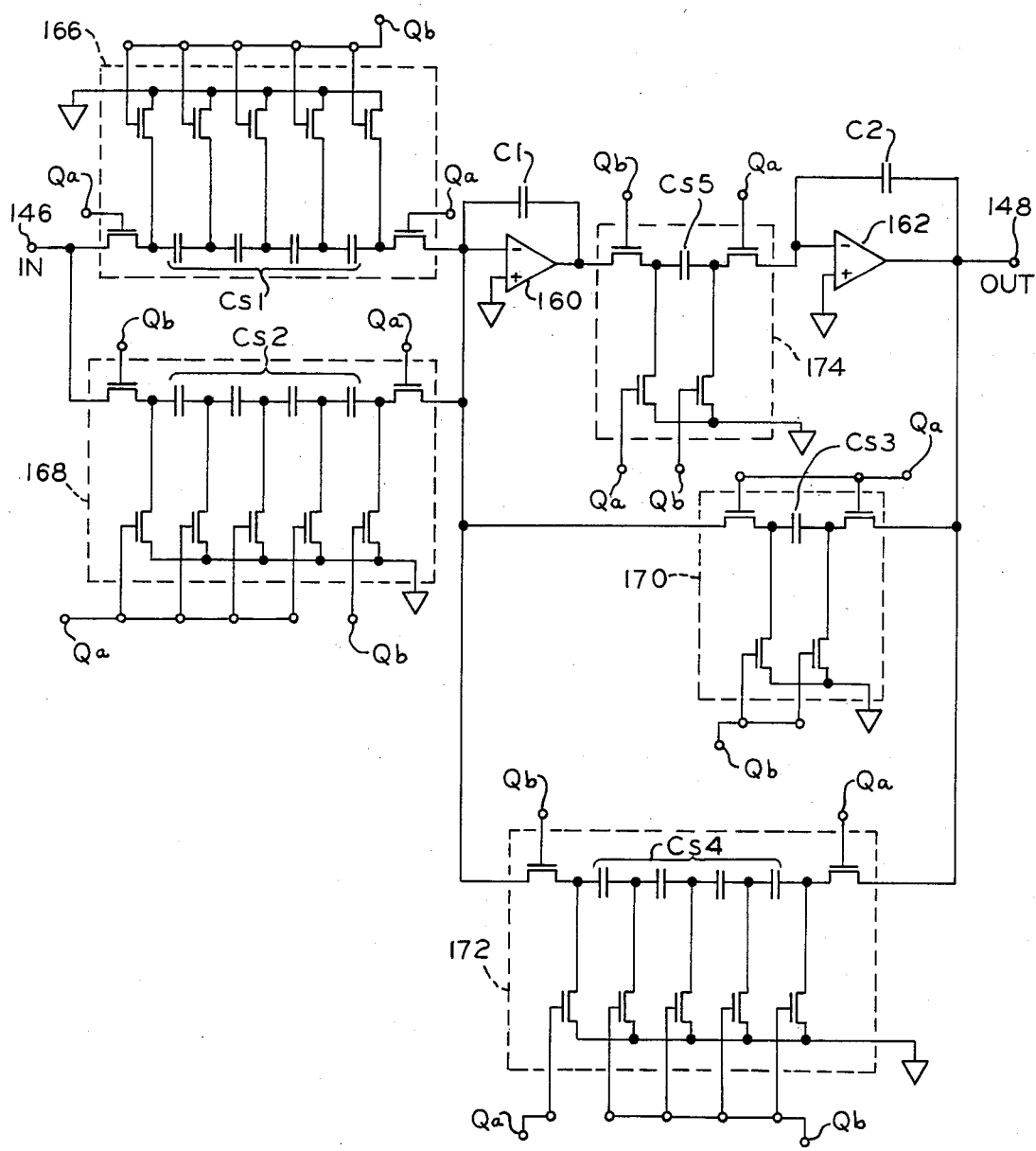
FIG. 8 is a schematic of the FIG. 7 circuit using the series connected switched capacitors of this invention.

The circuit of FIG. 8 is the SCF circuit of FIG. 7 modified in accordance with the present invention using a circuit N configuration, or N2, value of 4 instead of the model N value of 7. The total circuit capacitance of the FIG. 8 SCF circuit using the following described capacitors is approximately 52 MUCs which is slightly greater than the minimum capacity using the model N of 7, but still only about 33% of the 156 MUC minimum previously obtainable in the FIG. 7 circuit.

Referring to the circuit of FIG. 8, series switched capacitor circuits shown in dashed blocks 166, 168, 170, 172, 174 replace switched capacitor circuits 150, 152, 154, 156, 158 respectively in FIG. 7. Circuits 166, 168, 172 are similar in construction and function to circuit 82, FIG. 4, with an exception that 4 series connected switched capacitors are shown in each circuit instead of the 5 series connected switched capacitors in circuit 82 and the description and explanation of circuit 82 applies for circuits 166, 168, 172. Similarly, circuits 170, 174 are similar in construction, operation and function to circuit 80, FIG. 4, and the description and explanation of circuit 80 applies for circuits 170, 174. The circuit of FIG. 4 has similar symbols to represent corresponding components in the circuit of FIG. 4.

Each of the switched capacitor arms in the circuit of FIG. 8 representing Cs1, Cs2, and Cs4 is comprised of 4 one MUC series switched capacitors. Capacitor Cs3 is comprised of a single switched capacitor of 2.75 MUCs. Capacitor C1 is comprised of a single 12.73 MUC nonswitched capacitor. Capacitor Cs5 is comprised of a single switched one MUC capacitor and C2 is comprised of a single one MUC nonswitched capacitor. The MOS switches are similarly shown in FIGS. 3, 4 and 8 and the switching signals Qa, Qb are derived and applied to their respective switching terminals, and operate at a frequency $f_s$ to open and close the MOS switches as previously described.

Referring now to FIG. 9, there is shown another example of a prior art switched capacity circuit in the form of an all pass network having input terminal 176 and output terminal 178 which can be modified in accordance with this invention. In circuit 175 of FIG. 9 the input signal is applied to terminal 176 and the output signal is taken at terminal 178. Circuit 175 has a first operational amplifier stage utilizing operational amplifier 180 and a second amplifier stage utilizing operational amplifier 182. Operational amplifiers 180, 182 are of the type and operate in the manner of operational amplifiers 22, FIG. 2. Switched capacitor circuits shown in dashed blocks 184, 186, 192 for capacitors Cs1, Cs2, Cs5 respectively each are similar to circuit 46, FIG. 2, and are constructed, operate and function similarly. Switched capacitor circuit shown in dashed block 188 for capacitor Cs3 is similar in construction, operation and function to circuit 46 except that the switch blades operate to alternately switch the opposite plates 194, 196 of capacitor Cs3 to ground 200. In the position shown, blade 202 couples plate 194 to ground 200 and blade 204 couples plates 196 to line 206. In the switched position, not shown, blade 202 couples plate 194 to input line 208 and blade 204 couples plate 196 to ground 200. Switched capacitor circuit 190 for capacitor Cs4 is similar in construction, operation and function to switch 188 with the opposite plates 210, 212 of capacitor Cs4 being alternately switched to ground 200 by blades 214, 216. In the position shown blade 214 couples plate 210 to line 218 and blade 216 couples plate 210 to ground 200. In the switched position, not shown, blade 214 couples plate 210 to ground 200 and blade 216 couples plate 212 to line 220. As with the other prior art circuits, the operation of circuit 175 is known to the art.

Circuit 175 uses conventional capacitor switching where Cs1, Cs2, Cs3, Cs4, Cs5 are conventional switched capacitors. Capacitors C1, C2, C3 are nonswitched capacitors. For purposes of illustration, example numerical ratios of the capacity of each of the following capacitors to the capacity of Cs1 are; Cs1, 1; Cs2, 1; Cs3, 1; Cs4, 1; Cs5, 1; C1, 160; C2, 54; C3, 54. When the smallest value capacitors are reduced to one MUC, by use of conventional prior art SCF circuits, i.e. switching of single capacitors, the minimum total circuit capacitance obtainable is 273 MUCs, the sum of the aforestated ratios, since the indicated ratios represent the corresponding capacities in MUCs. The indicated ratios associated with capacitors Cs1, Cs2 and C1 are associated with the first stage amplifier 180 whereas the ratios associated with capacitors Cs3, C2, Cs4, Cs5, C3 are associated with the second stage amplifier 182. The two sets of ratios can if desired be treated separately. As an example, capacitors Cs1 and Cs2 can be series switched in accordance with the invention to provide a reduction in the capacity of C1. Likewise, capacitors Cs3, Cs4, and Cs5 can be series switched to provide a reduction of the capacity of capacitors C2 and C3. In the following, first the two sets of ratios will be treated separately and then the two sets of ratios will be combined into one set of ratios.

In treating the two sets of ratios separately, the circuit capacitance of each capacitor in MUCs in the first stage amplifier 180 is represented as follows where $N =$ the number of switched series connected capacitors of one MUC each for Cs1:

$$Cs1 = N; Cs2 = N; C1 = 160/N.$$

The expression representing the total circuit capacitance for the first stage amplifier 180 in MUCs thus becomes:

$$2N + 160/N = \text{Total Circuit capacitance } MUCs$$

The circuit capacitance of each capacitor in MUCs in the second stage amplifier 182 is represented as follows where $N =$ the number of switched series connected capacitors of one MUC each for Cs3:

$$CS3 = N; Cs4 = N; Cs5 = N; C2 = 54/N; C3 = 54/N.$$

The expression representing the total circuit capacitance for the second stage amplifier 182 in MUCs thus becomes:

$$3N + 108/N = \text{Total Circuit capacitance } MUCs$$

When the each of the above Total Circuit capacitance MUCs expressions are solved for a model N that will give a minimum number of Total Circuit capacitance MUCs, N is found to be approximately 9 for the first stage amplifier 180 and N is found to be approximately 6 for the second stage amplifier 182. Using N's of 9 and 6, respectively, for the first stage amplifier 180 and the second stage amplifier 182 will provide a total minimum circuit capacitance of approximately 71.8 MUCs which is approximately 26% of the total capacity of 273 MUCs which is the minimum obtainable with the filter circuit of FIG. 9 using conventional switching capacitor circuitry.

The circuit of FIG. 10 has series connected switched capacitor circuits shown in dashed blocks 226, 228, 230, 232, 234 replacing, respectively, the FIG. 9 circuits 184, 186, 188, 190, 192. Circuits 226, 228, 230, 232, 234 are similar in construction, operation and function to circuit 82, FIG. 4, with an exception that circuits 226, 228 each has nine series connected switched capacitors and circuits 230, 232, 234 each has six series connected switched capacitors, instead of the five series connected switched capacitors in circuit 82. The description and explanation for circuit 82 also applies to circuits 226, 228, 230, 232, 234. The MOS switches are similarly shown as in FIG. 4 and operate in similar manner, the switching signals Qa, Qb being derived and applied to their respective switching terminals, and operating at a frequency $f_s$ to open and close the MOS switches as previously described.

Thus each one of the series connected switched capacitor arms representing capacitors Cs1 and Cs2 comprise 9 one MUC series connected switched capacitors. Capacitor C1 comprises a single nonswitched capacitor of 17.77 MUCs. Each one of the series switched arms representing capacitors Cs3, Cs4, Cs5 comprise 6 one MUC series connected switched capacitors and C2 and C3 each comprise a single nonswitched capacitor of 9 MUCs.

The circuit of FIG. 9 can also be considered as a single circuit instead of two separate circuits as above. The capacity ratios for the capacitors of FIG. 9 when considered as a single circuit are determined as in the previously described examples for circuits of FIGS. 2, 5, 7 giving the following equation:

$$5N + 268/N = \text{Total circuit capacitance in } MUCs$$

The model N for minimum circuit capacitance for this equation is approximately 7 which gives a minimum circuit capacitance of approximately 73.3 MUCs, 1.5 MUCs more than the total minium circuit capacitance when the circuit of FIG. 9 is considered as two separate circuits.

In the foregoing circuits, operational amplifier 22 and the other operational amplifiers herein and MOS switches 68, 70, 72, 74 and the other MOS switches described above are shown in conventional form, it being understood that equivalent components and circuits can be integrated on a stratum by techniques known to the art.

Although the preceding circuits describing implementation of the present invention comprise certain type filter circuits, the invention is not limited to use in these circuits. This invention can be used in any switched capacitor circuit having characteristics which are a function of capacity ratios. Capacitor switching devices and capacitor switching circuitry other than that shown can be used and for a given number of series switched capacitors in a capacitor arm, the number of switching devices need not be limited to that which is shown. The present invention is not limited to single or dual pole filters as shown and can be used to reduce the circuit capacity of complex multipole switched capacitor filter circuits or networks as well. This invention is not limited to circuits using operational amplifiers. The expressions for total MUC circuit capacitance are shown to demonstrate a method of determining a model number of series switched capacitors for providing a minimum of total circuit capacitance, other expressions and methods of the determination of desired number of series switched capacitors may be used and, as explained above, the present invention is not limited to the model number of series switched capacitors. Also, the values of the switched capacitors may be greater than one MUC and using the teaching of this invention reduced circuit capacitance and integrated area may be obtained. Also from the above it is seen in this invention that the Ratio-1 between the nonswitched capacitor and the switched capacitor is greater than one and the number N of switched capacitors is less than Ratio-1 and greater than one. Further, as is understood in the art and as can be seen from the above, equation No. 4, $f_{co}$ is a function of $f_s$ and therefore may be varied by varying $f_s$. This invention applies to circuits of materials and fabrication techniques other than those disclosed to obtain equivalent results as is understood in the art.

While there have been described above the principles of this invention in connection with specific embodiments, it is to be understood that this is by way of example and is not limiting of the scope of this invention.

What is claimed is:

1. In a filter circuit having an input terminal and an output terminal, said filter circuit having amplifying means with an input and an output terminal, a feedback circuit coupled between the amplifying means input and output terminals, said filter circuit output terminal being coupled to said amplifying means output terminal, said filter circuit comprising circuit components integrated on a monolithic or film stratum having a practical minimum unit of capacitance defined as a MUC, that improvement comprising:

a first switched capacitor circuit having first and second end terminals and having a first terminal capacity therebetween, with said first and second end terminals being coupled to said amplifying means input and output terminals, respectively;

a capacitor circuit having first and second terminals coupled to said amplifying means input and output terminals, respectively, and having a second terminal capacity, more than said first terminal capacity, whereby a first ratio "R1" of said second terminal capacity to said first terminal capacity is greater than one;

said first switched capacitor circuit comprising a number "N" of series connected capacitors, said number N being greater than one and less than said ratio R1; each of said series connected capacitors having a first connection point at one plate of said each capacitor and a second connection point at the other plate of said each capacitor; said series connected capacitors including a first and a last capacitor and the remaining capacitors of said series connected capacitors being connected in series between said first and last capacitors at said connection points; said first connection point of said first capacitor being coupled to said first end terminal of said first switched capacitor circuit and said second connection point of said last capacitor being coupled to said second end terminal of said first switched capacitor circuit; said first connection points of said remaining capacitors and said last capacitor being connected to respective second connection points of respective next adjacent capacitors at respective junctions; parasitic capacitances being associated with said series connected capacitors;

discharge circuit means for providing capacitor plate discharge to a reference potential;

clock phase means for providing in alternation first and second clock phases at a predetermined frequency;

first and second switching means controlled by said clock phase means and connected to said first and second end terminals respectively of said first switched capacitor circuit for coupling said first and second end terminals to the amplifying means input and output terminals respectively during said first clock phase and uncoupling said first and second end terminals from the amplifying means input and output terminals respectively during said second clock phase;

a plurality of third switching means controlled by said clock phase means, a said third switching means connected to each said first and second end terminals and to said junctions in said first switched capacitor circuit for coupling each plate of each of said plurality of series connected capacitors to said discharge circuit means for discharging each plate of each of said number N of capacitors in said first switched capacitor circuit at said predetermined frequency to said discharge circuit means during said second clock phase to reduce the effects of parasitic capacities associated with said first switched capacitor circuit and for uncoupling each plate of each of said plurality of series connected capacitors from said discharge circuit means during said first clock phase.

2. The apparatus of claim 1 wherein each of said series connected capacitors is equal to approximately one MUC.

3. The apparatus of claim 1 wherein said number N is selected to minimize the total integrated area on the stratum required by the circuit capacitance and said switching means.

4. The apparatus of claim 1 or 2 wherein said number N equals a number "N1", such that the total of said number N1 plus the quantity of said ratio R1 divided by said number N1 is a predetermined reduced total and the filter circuit capacitance is correspondingly reduced.

5. The apparatus of claim 4 wherein said number N equals said number N1 such that the circuit total of said number N1 plus the quantity of said ratio R1 divided by said number N1 is a substantially minimum total and the filter circuit capacitance is correspondingly reduced.

6. The apparatus of claim 1 wherein said capacitor circuit comprises a nonswitched capacitor.

7. The apparatus of claim 1 including a second switched capacitor circuit having first and second end terminals between which there is a third terminal capacity equal to or greater than said first terminal capacity whereby a second ratio "R2" of said third terminal capacity to said first terminal capacity is equal to or greater than one;

said second switched operator circuit comprising a plurality of series connected capacitors; each of said second switched capacitor circuit series connected capacitors having a first connection point at one plate of said each capacitor and a second connection point at the other plate of said each capacitor; said second switched capacitor circuit series connected capacitors including a first and a last capacitor and the remaining capacitors of said second switched capacitor circuit series connected capacitors being connected in series between said second switched capacitor circuit first and last capacitors at said connection points; said first connection point of said second switched capacitor circuit first capacitor being coupled to said first end terminal of said second switched capacitor circuit and said second connection point of said second switched capacitor circuit last capacitor being coupled to said second end terminal of said second switched capacitor circuit; said first connection points of said second switched capacitor circuit remaining capacitors and said second switched capacitor circuit last capacitor being connected to respective second connection points of respective next adjacent second switched capacitor circuit capacitors at respective junctions; parasitic capacitances being associated with said second switched capacitor circuit series connected capacitors;

said first and second switching means controlled by said clock phase means and being connected to said first and second end terminals respectively of said second switched capacitor circuit for coupling said second switched capacitor circuit first and second end terminals to the filter circuit input and amplifying means input terminals respectively during said first clock phase and uncoupling said second switched capacitor circuit first and second end terminals from the filter circuit input and amplifying means input terminals respectively during said second clock phase;

said plurality of third switching means controlled by said clock phase means and comprising a said third switching means connected to each said second switched capacitor circuit first and second end terminals and to said junctions in said second switched capacitor circuit for coupling each plate of each of said second switched capacitor circuit plurality of series connected capacitors to said discharge circuit means for discharging each plate of each of said plurality of capacitors in said second switched capacitor circuit to said discharge circuit means during said second clock phase to reduce the effects of parasitic capacities associated with said second switched capacitor circuit and for uncoupling each plate of each of said plurality of second switched capacitor circuit series connected capacitors from said discharge circuit means during said first clock phase.

8. The apparatus of claim 7 wherein said number N of said first switched capacitor circuit equals a number "N1" such that a circuit total of said number N1 plus the quantity of said ratio R1 divided by said number N1 plus the quantity of said number N1 divided by said ratio R2 is a predetermined reduced total and the total filter circuit capacitance of said second switched capacitor circuit is correspondingly reduced.

9. The apparatus of claim 1 or 7 wherein said number N equals a number "N2", said number N2 being less than said number N1 and selected to minimize the total integrated area on the stratum required by the filter circuit capacitance and said switching means.

10. The apparatus of claim 1, 2, 3, 6, 7 or 8 wherein said first, second and third switching means comprises a semiconductor switching means.

11. The apparatus of claim 1 including a second switched capacitor circuit having first and second end terminals between which there is a third terminal capacity equal to or greater than said first terminal capacity whereby a second ratio "R2" of said third terminal capacity to said first terminal capacity is equal to or greater than one;

said second switched capacitor circuit comprising a capacitor having a first connection point at one plate and a second connection point at the other plate; said first connection point of said second switched capacitor circuit capacitor being coupled to said first end terminal of said second switched capacitor circuit and said second connection point of said second switched capacitor circuit capacitor being coupled to said second end terminal of said second switched capacitor circuit; parasitic capacitances being associated with said second switched capacitor circuit capacitor;

said first and second switching means controlled by said clock phase means and being connected to said first and second end terminals respectively of said second switched capacitor circuit for coupling said second switched capacitor circuit first and second end terminals to the filter circuit input and amplifying means input terminals respectively during said first clock phase and uncoupling said second switched capacitor circuit first and second end terminals from the filter circuit input and amplifying means input terminals respectively during said second clock phase;

said plurality of third switching means controlled by said clock phase means and comprising a said third switching means connected to each said second switched capacitor circuit first and second end terminals for coupling each plate of said second switched capacitor circuit capacitor to said discharge circuit means for discharging each plate of said capacitor in said second switched capacitor circuit to said discharge circuit means during said second clock phase to reduce the effects of parasitic capacities associated with said second switched capacitor circuit and for uncoupling each plate of said second switched operator circuit capacitor from said discharge circuit means during said first clock phase.

12. The apparatus of claim 11 wherein said amplifying means comprises an operational amplifier having an inverting and a noninverting input terminal and an output terminal; said second switched capacitor circuit being coupled between the filter circuit input terminal and said inverting input terminal; said first switched capacitor circuit having its first terminal coupled to said inverting input terminal and its second terminal coupled to said amplifier output terminal; said capacitor circuit being coupled in parallel across said first and second terminals of said first switched capacitor circuit; the gain of the filter circuit being equal to said second ratio R2.

13. In a switched capacitor circuit having first and second circuit terminals wherein capacitor components are integrated on a monolithic or film stratum an improvement for reducing the effects of parasitic capacities comprising:

a capacity arm having first and second end terminals and comprising a plurality of series connected capacitors, each of said series connected capacitors having a first connection point at one plate of said each capacitor and a second connection point at the other plate of said each capacitor; said series connected capacitors including a first and a last capacitor and the remaining capacitors of said series connected capacitors being connected between said first and last capacitors in series at said connection points; said first connection point of said first capacitor being coupled to said first end terminal of said first capacity arm and said second connection point of said last capacitor being coupled to said second end terminal of said capacity arm; said first connection points of said remaining capacitors and said last capacitor being connected to respective second connection points of respective next adjacent capacitors at respective junctions; parasitic capacitances being associated with said series connected capacitors;

discharge circuit means for providing capacitor plate discharge to a reference potential;

clock phase means for providing in alternation first and second clock phases at a predetermined frequency;

first and second switching means controlled by said clock phase means and connected to said first and second end terminals respectively of said capacity arm for coupling said first and second end terminals to the first and second circuit terminals respectively during said first clock phase and uncoupling said first and second end terminals from the first and second circuit terminals respectively during said second clock phase;

a plurality of third switching means controlled by said clock phase means, a said third switching means connected to each said first and second end terminals and to said junctions in said capacity arm for coupling each plate of each of said plurality of series connected capacitors to said discharge circuit means for discharging each plate of each of said plurality of capacitors in said capacity arm at said predetermined frequency to said discharge circuit means during said second clock phase to reduce the effects of parasitic capacities associated with said capacity arm and for uncoupling each plate of each of said plurality of series connected capacitors from said discharge circuit means during said first clock phase.

14. The apparatus of claim 13 wherein each of said plurality of series connected capacitors is substantially equal in value.

* * * * *

UNITED STATES PATENT AND TRADEMARK OFFICE
CERTIFICATE OF CORRECTION

PATENT NO. : 4,543,546

DATED : September 24, 1985

INVENTOR(S) : Peruvamba R. Hariharan

It is certified that error appears in the above—identified patent and that said Letters Patent is hereby corrected as shown below:

```
Title page, in the paragraph under "[57] ABSTRACT",
    l. 2   for "having" read --has--;
Col. 2,  l. 67, for "device" read --devices--;
Col. 4,  l. 35 after "prior" insert --art--;
Col. 8,  l. 22 for "114" read --114a--;
Col. 8,  l. 34 for "74" read --74,--;
Col. 9,  l. 58 for "there" read --where--;
Col. 11, l. 53 after "Circuit" insert --capacitance--;
Col. 13, l. 32 after "Circuit" insert --capacitance--;
Col. 14, l. 50 for "4" read --8--;
Col. 19, l. 18 for "operator" read --capacitor--;
Col. 20, l. 67 for "operator" read --capacitor--;
Col. 21, l. 3 for "11" read --7--.
```

Signed and Sealed this

Eighteenth Day of March 1986

[SEAL]

Attest:

DONALD J. QUIGG

Attesting Officer

Commissioner of Patents and Trademarks